(12) United States Patent (10) Patent No.: US 12,684,850 B2
Sambonsuge (45) Date of Patent: Jul. 14, 2026

(54) SILICON CARBIDE SEMICONDUCTOR DEVICE

(71) Applicant: SUMITOMO ELECTRIC INDUSTRIES, LTD., Osaka (JP)

(72) Inventor: Shota Sambonsuge, Osaka (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 392 days.

(21) Appl. No.: 18/681,997

(22) PCT Filed: Sep. 5, 2022

(86) PCT No.: PCT/JP2022/033213

§ 371 (c)(1),
(2) Date: Feb. 7, 2024

(87) PCT Pub. No.: WO2023/058377

PCT Pub. Date: Apr. 13, 2023

(65) Prior Publication Data

US 2024/0339419 A1 Oct. 10, 2024

(30) Foreign Application Priority Data

Oct. 5, 2021 (JP) ................................. 2021-164049

(51) Int. Cl.
H01L 23/00 (2006.01)
H10D 30/66 (2025.01)
(Continued)

(52) U.S. Cl.
CPC ......... *H10D 64/252* (2025.01); *H10D 30/668* (2025.01); *H10D 62/8325* (2025.01); *H10D 64/258* (2025.01); *H10D 64/62* (2025.01); *H10D 30/0297* (2025.01); *H10W 72/01935*

(2026.01); *H10W 72/29* (2026.01); *H10W 72/59* (2026.01); *H10W 72/90* (2026.01); *H10W 72/921* (2026.01); *H10W 72/923* (2026.01);

(Continued)

(58) Field of Classification Search
None
See application file for complete search history.

(56) References Cited

U.S. PATENT DOCUMENTS

2010/0240213 A1 9/2010 Urano et al.
2016/0247911 A1* 8/2016 Hiyoshi ............... H10D 30/668

(Continued)

FOREIGN PATENT DOCUMENTS

JP 2010-251719 11/2010
JP 2017-079225 4/2017

(Continued)

*Primary Examiner* — Asok K Sarkar
(74) *Attorney, Agent, or Firm* — IPUSA, PLLC

(57) ABSTRACT

A silicon carbide semiconductor device includes a silicon carbide substrate having a first main surface; a first electrode formed on the first main surface; and a plating film formed on the first electrode, wherein a first irregularity is formed on a surface of the plating film, and H1/H2 is 0.10 or less, where H1 is a difference between a maximum value of a distance to a top of the first irregularity from the first main surface and a minimum value of a distance to a bottom of the first irregularity from the first main surface, and H2 is a minimum value of a thickness of the plating film.

12 Claims, 9 Drawing Sheets

(51) Int. Cl.

| | |
|---|---|
| *H10D 62/832* | (2025.01) |
| *H10D 64/23* | (2025.01) |
| *H10D 64/62* | (2025.01) |
| *H10D 30/01* | (2025.01) |
| *H10W 72/00* | (2026.01) |
| *H10W 72/29* | (2026.01) |
| *H10W 72/59* | (2026.01) |
| *H10W 72/90* | (2026.01) |

(52) U.S. Cl.
CPC ........ *H10W 72/934* (2026.01); *H10W 72/952* (2026.01)

(56) References Cited

U.S. PATENT DOCUMENTS

| | | | |
|---|---|---|---|
| 2017/0110544 A1 | 4/2017 | Hoshi et al. | |
| 2019/0393333 A1 | 12/2019 | Fujita et al. | |
| 2024/0096954 A1* | 3/2024 | Shin .................... | H10D 64/258 |
| 2026/0068206 A1* | 3/2026 | Tanaka ............... | H10D 30/0297 |

FOREIGN PATENT DOCUMENTS

| | | |
|---|---|---|
| JP | 2017-128791 | 7/2017 |
| WO | 2018/167925 | 9/2018 |

* cited by examiner

SILICON CARBIDE SEMICONDUCTOR DEVICE

TECHNICAL FIELD

The present disclosure relates to a silicon carbide semiconductor device.

This application is based on and claims priority to Japanese Patent Application No. 2021-164049 filed on Oct. 5, 2021, the entire contents of which are incorporated herein by reference.

BACKGROUND ART

A method of forming an electrode that includes aluminum (Al) on a semiconductor wafer such as a silicon wafer, and then forming a nickel (Ni) plating film having different phosphorus (P) concentrations on the electrode, as an under bump metal, has been proposed.

RELATED ART DOCUMENTS

Patent Documents

[Patent Document 1] Japanese Unexamined Patent Application Publication No. 2017-128791

SUMMARY OF THE INVENTION

A silicon carbide semiconductor device includes
a silicon carbide substrate having a silicon carbide substrate having a first main surface;
a first electrode formed on the first main surface; and
a plating film formed on the first electrode,
wherein a first irregularity is formed on a surface of the plating film, and H1/H2 is 0.10 or less, where H1 is a difference between a maximum value of a distance to a top of the first irregularity from the first main surface and a minimum value of a distance to a bottom of the first irregularity from the first main surface, and H2 is a minimum value of a thickness of the plating film.

EMBODIMENT FOR CARRYING OUT THE INVENTION

Figure 1:
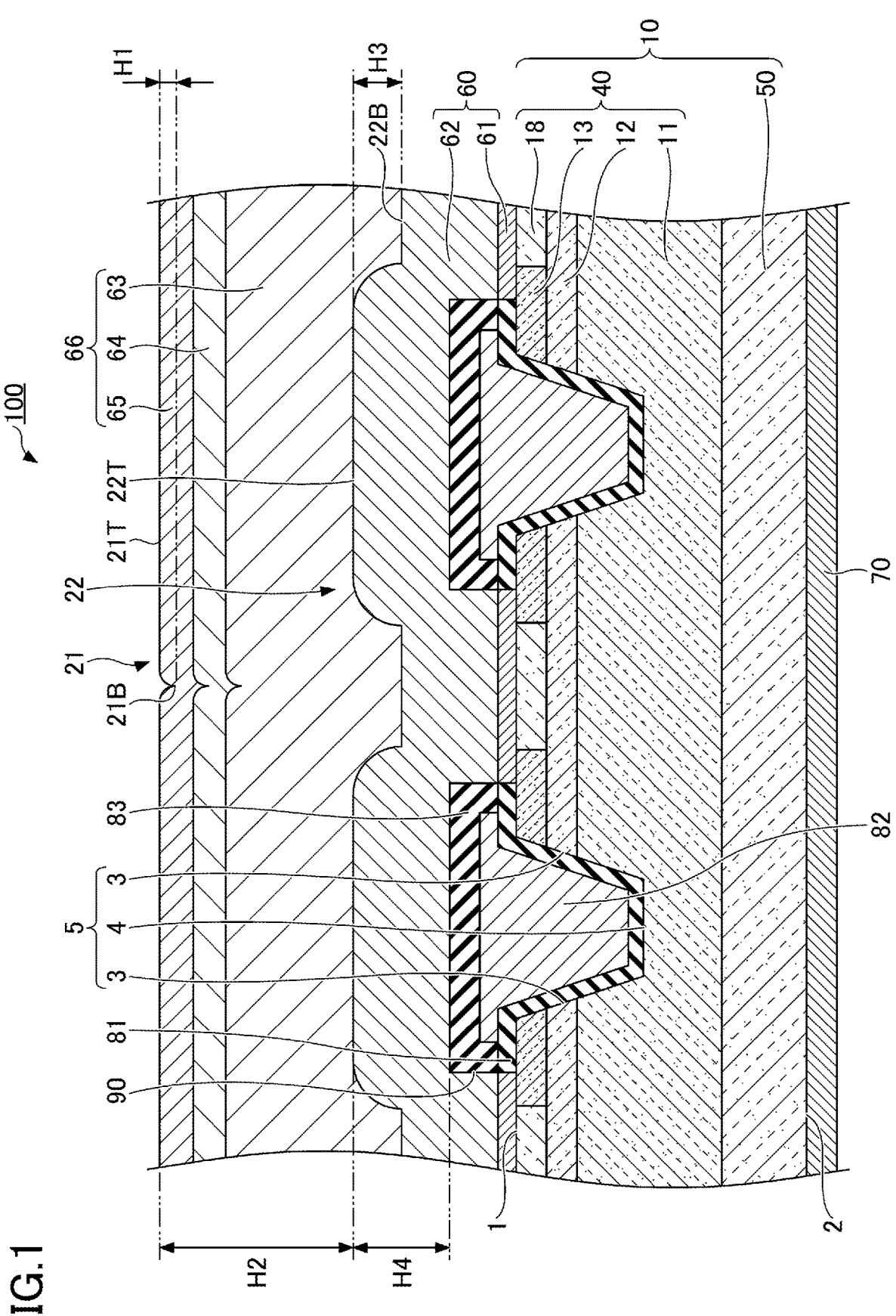
FIG. 1 is a cross-sectional view illustrating a silicon carbide semiconductor device according to an embodiment.

Problems to be Solved by the Present Disclosure

In cases where a plating film is formed using a conventional method, there have been instances where cracking occurs in the plating film when wire bonding is performed on the plating film.

Thus, the present disclosure aims to provide a silicon carbide semiconductor device in which cracking in the plating film caused by wire bonding can be suppressed.

Effect of the Present Disclosure

According to the present disclosure, cracking in the plating film caused by wire bonding can be suppressed.

Embodiments will be described below.

Description of Embodiments of the Present Disclosure

First, embodiments of the present disclosure are listed and described. In the description below, the same or corresponding members or components are denoted by the same or corresponding reference numerals and the description thereof will not be repeated. In crystallographic description in the present specification, an individual orientation is indicated by [ ], a group orientation is indicated by < >, an individual plane is indicated by ( ), and a group plane is indicated by { }. Additionally, a negative crystallographic index is usually expressed by putting "-" (bar) above a number, but in the present specification, a negative sign is put before a number.

[1] A silicon carbide semiconductor device according to a first aspect of the present disclosure includes: a silicon carbide substrate having a first main surface; a first electrode formed on the first main surface; and a plating film formed on the first electrode, wherein a first irregularity is formed on a surface of the plating film, and H1/H2 is 0.10 or less, where H1 is a difference between a maximum value of a distance to a top of the first irregularity from the first main surface and a minimum value of a distance to a bottom of the first irregularity from the first main surface, and H2 is a minimum value of a thickness of the plating film.

Since H1/H2 is 0.10 or less, stress concentration on the plating film due to wiring bonding is mitigated, and thus, cracking in the plating film caused by wire bonding can be suppressed.

[2] In [1], a second irregularity may be formed on a surface of the first electrode, and H3/H4 may be 0.30 or greater and 0.80 or less, where H3 is a difference between a maximum value of a distance to a top of the second irregularity from the first main surface and a minimum value of a distance to a bottom of the second irregularity from the first main surface, and H4 is a minimum value of a thickness of the first electrode. In such a case, the first irregularity on the surface of the plating film can be easily suppressed while avoiding a drop in manufacturing productivity.

[3] In [1] or [2], H1/H2 may be 0.01 or greater and 0.10 or less. In order to make the value of H1/H2 be 0.10 or less, processing such as polishing or the like is necessary, and thus manufacturing productivity might drop.

[4] In any one of [1] to [3], the first electrode may contain aluminum or an aluminum alloy. In such a case, it is easy to keep the electrical resistance of the first electrode low.

[5] In any one of [1] to [4], the plating film may include a nickel plating film. In such a case, it is easy to keep the first electrode protected.

[6] In [5], an average crystal grain size at a surface of the nickel plating film may be 1.0 μm or greater and 20.0 μm or less. In such a case, cracking can be more easily suppressed while avoiding a drop in manufacturing productivity.

[7] In [5] or [6], the plating film may further include either a gold plating film or a silver plating film formed on or above the nickel plating film. In such a case, it is easy to obtain excellent corrosion resistance in the plating film.

[8] In [7], the plating film may further include a palladium plating film that is formed between the nickel plating film and either the gold plating film or the silver plating film. In such a case, it is easy to suppress denaturation of the nickel plating film when the gold plating film or the silver plating film is formed.

[9] In any one of [1] to [4], the plating film may include a copper plating film. In such a case, it is easy to keep the first electrode protected.

[10] In [9], an average crystal grain size at a surface of the copper plating film may be 1.0 μm or greater and 20.0 μm or less. In such a case, cracking can be more easily suppressed while avoiding a drop in manufacturing productivity.

[11] In [9] to [10], the plating film may further include a tantalum nitride film or a titanium nitride film formed between the first electrode and the copper plating film. In such a case, the tantalum nitride film or the titanium nitride film can function as a barrier metal.

[12] In any one of [1] to [11], silicon carbide semiconductor device may further include a second electrode formed on the first main surface; and an insulating film that covers the second electrode, and the first electrode may cover the insulating film. In such a case, the first electrode and the second electrode are isolated from each other.

Embodiment of the Present Disclosure

Hereinafter, embodiments of the present disclosure are described in detail, but the present disclosure is not limited thereto. FIG. 1 is a cross-sectional view of a silicon carbide semiconductor device according to an embodiment.

As illustrated in FIG. 1, a silicon carbide semiconductor device 100 according to the embodiment primarily includes a silicon carbide substrate 10, a gate insulating film 81, a gate electrode 82, an interlayer insulating film 83, a source electrode 60, and a drain electrode 70.

The silicon carbide substrate 10 includes a silicon carbide single-crystal substrate 50 and a silicon carbide epitaxial layer 40 on the silicon carbide single-crystal substrate 50. The silicon carbide substrate 10 has a first main surface 1 and a second main surface 2 opposite to the first main surface 1. The silicon carbide epitaxial layer 40 forms the first main surface 1, and the silicon carbide single-crystal substrate 50 forms the second main surface 2. The silicon carbide single-crystal substrate 50 and silicon carbide epitaxial layer 40 are formed of, for example, hexagonal silicon carbide of polytype 4H. The silicon carbide single-crystal substrate 50 contains an n-type impurity such as nitrogen (N), and thus has an n-type. Semiconductor elements are formed on the silicon carbide substrate 10.

The first main surface 1 is a {0001} plane or a plane inclined from the {0001} plane by an off angle of 8° or less in the off direction. Preferably, the first main surface 1 is a (000-1) plane or a plane inclined from the (000-1) plane by an off angle of 8° or less in the off direction. The off direction may be, for example, the <11-20> direction or the <1-100> direction. The off angle may be, for example, 1° or greater, or 2° or greater. The off angle may be 6° or less, or may be 4° or less.

In the present embodiment, as one example, a field effect transistor is formed, as the semiconductor elements, on the silicon carbide substrate 10. The silicon carbide epitaxial layer 40 primarily has a drift region 11, a body region 12, a source region 13, and a contact region 18.

The drift region 11 has the n-type owing to the drift region 11 being doped with an n-type impurity, such as nitrogen or phosphorus (P). It is preferable that the doping of the drift region 11 is not performed by ion implantation but by impurity doping during epitaxial growth of the drift region 11.

The body region 12 is provided on the drift region 11. The body region 12 has a p-type impurity owing the body region 12 being doped with a p-type impurity, such as aluminum (Al).

The source region 13 is provided on the body region 12 such that the source region 13 is separated from the drift region 11 by the body region 12. The source region 13 has the n-type owing the source region 13 being doped with an n-type impurity, such as nitrogen or phosphorus (P). The source region 13 forms the first main surface 1.

The contact region 18 has a p-type impurity owing to contact region 18 being doped with a p-type impurity, such as aluminum (Al). The contact region 18 forms the first main surface 1. The contact region 18 passes through the source region 13 and comes in contact with the body region 12.

Multiple gate trenches 5 are provided in the first main surface 1. The gate trench 5 extends, for example, in a first direction parallel to the first main surface 1, and the multiple gate trenches 5 are arranged in a second direction. The gate trench 5 has a bottom surface 4 formed by the drift region 11. The gate trench 5 has side surfaces 3 that pass through the source region 13 and the body region 12 and that are continuous with the bottom surface 4. The bottom surface 4 is, for example, a plane parallel to the second main surface 2. An angle of the side surface 3 with respect to a plane including the bottom surface 4 is, for example, 50° or greater and 65° or less. The angle may be 55° degrees or greater, for example. The angle may be 60° or less, for example. The side surface 3 preferably has a {0-33-8} plane. The {0-33-8} plane is a crystal plane in which excellent mobility is obtained. An angle of the side surface 3 with respect to the plane including the bottom surface 4 may be, for example, 90°.

The gate insulating film 81 is provided in contact with the side surfaces 3 and the bottom surface 4. The gate insulating film 81 is, for example, an oxide film. The gate insulating film 81 is made of, for example, a material containing silicon dioxide. The gate insulating film 81 is in contact with the drift region 11 at the bottom surface 4. The gate insulating film 81 is in contact with each of the source region 13, the body region 12, and the drift region 11 at the side surfaces 3. The gate insulating film 81 may be in contact with the source region 13 at the first main surface 1.

The gate electrode 82 is provided on the gate insulating film 81. The gate electrode 82 is made of, for example, polysilicon (poly-Si) that contains conductive impurities. The gate electrode 82 is disposed inside the gate trench 5. The gate electrode 82 is an example of the second electrode.

The interlayer insulating film 83 is provided in contact with the gate electrode 82 and the gate insulating film 81. The interlayer insulating film 83 is made of, for example, a material containing silicon dioxide. Contact holes 90 are formed in the interlayer insulating film 83 and the gate insulating film 81 at constant intervals in the second direction. The contact holes 90 are provided such that the gate trench 5 is positioned between the contact holes 90 adjacent to each other in the second direction. The contact hole 90 extends in the first direction. The source region 13 and the contact region 18 are exposed from the interlayer insulating film 83 and the gate insulating film 81 through the contact hole 90. The depth of the contact hole 90 may be, for example, 0.8 μm or greater and 1.5 μm or less, or 1.0 μm or greater and 1.3 μm or less. Further, the diameter of the contact hole 90 may be, for example, 2.0 μm or greater and 5.0 μm or less, or 2.5 μm or greater and 4.5 μm or less. The interlayer insulating film 83 is an example of the insulating film.

The source electrode 60 is provided in contact with the first main surface 1. The source electrode 60 includes a contact electrode 61 provided in the contact hole 90 and a source wiring 62. The contact electrode 61 is in contact with the source region 13 and the contact region 18 in the first main surface 1. The contact electrode 61 is made of, for example, a material containing nickel silicide (NiSi). The contact electrode 61 may be made of a material containing titanium (Ti), aluminum, and silicon. The contact electrode 61 is in ohmic contact with the source region 13 and the contact region 18. In other words, the source electrode 60 is connected to the silicon carbide substrate 10 via the contact hole 90. The source wiring 62 is made of, for example, a material containing aluminum, an aluminum alloy, copper (Cu), or a copper alloy. The source wiring 62 may be made of a material containing aluminum and copper. The source electrode 60 is electrically insulated from the gate electrode 82 by the interlayer insulating film 83. The source electrode 60 may include a barrier metal film such as a titanium nitride (TiN) between the source wiring 62 and the interlayer insulating film 83. The source electrode 60 is an example of the first electrode.

A second irregularity 22 reflecting the contact hole 90 is formed on the surface of the source electrode 60. The thickness of the source electrode 60 is lowest immediately above the interlayer insulating film 83, for example. The thickness of the source electrode 60 in the present disclosure is referred to as the thickness in the direction perpendicular to the first main surface 1. For example, a relationship of $0.30 \leq H3/H4 \leq 0.80$ (i.e., H3/H4 is 0.30 or greater and 0.80 or less) is established, where H3 is a difference between a maximum value of a distance to a top 22T of the second irregularity 22 from the first main surface 1 and a minimum value of a distance to bottom 22B of the second irregularity 22 from the first main surface 1, and H4 is a minimum value of the thickness of the source electrode 60.

The plating film 66 is formed on the source electrode 60. The plating film 66 includes a nickel (Ni) plating film 63, a palladium (Pd) plating film 64, and a gold (Au) plating film 65. The Ni plating film 63 is formed on the source electrode 60 and contains phosphorus (P). The Pd plating film 64 is formed on the Ni plating film 63. The Au plating film 65 is formed on the Pd plating film 64. The thickness of the Ni plating film 63 is preferably 4.0 μm or greater and 8.0 μm or less, and more preferably 5.0 μm or greater and 7.0 μm or less. The thickness of the Pd plating film 64 is preferably 20 nm or greater and 40 nm or less, and more preferably 25 nm or greater and 35 nm or less. The thickness of the Au plating film 65 is preferably 30 nm or greater and 70 nm or less, and more preferably 40 nm or greater and 60 nm or less. In the present disclosure, the thickness of the Ni plating film 63, the Pd plating film 64, and the Au plating film 65 are referred to as the thickness in the direction perpendicular to the first main surface 1.

A first irregularity 21 reflecting the second irregularity 22 of the source electrode 60 is formed on the surface of the plating film 66. The thickness of the plating film 66 is lowest immediately above the interlayer insulating film 83, for example. The thickness of the plating film 66 in the present disclosure is referred to as the thickness in the direction perpendicular to the first main surface 1. For example, a relationship of $H1/H2 \leq 0.10$ (i.e., H1/H2 is 0.10 or less) is established, where H1 is the difference between a maximum value of the distance to a top 21T of the first irregularity 21 from the first main surface 1 and a minimum value of a distance to a bottom 21B of the first irregularity 21 from the first main surface 1, and H2 is a minimum value of the thickness of the plating film 66.

The drain electrode 70 is in contact with the second main surface 2. The drain electrode 70 is in contact with the silicon carbide single-crystal substrate 50 at the second main surface 2. The drain electrode 70 is electrically connected to the drift region 11. The drain electrode 70 is made of, for example, a material containing nickel silicide. The drain electrode 70 may be made of a material containing titanium, aluminum, and silicon. The drain electrode 70 is in ohmic contact with the silicon carbide single-crystal substrate 50.

Here, the acceptor concentration and the donor concentration of each of the impurity regions can be measured by a measurement using a scanning capacitance microscope (SCM), secondary ion mass spectrometry (SIMS), or the like, for example.

Next, a method for manufacturing the silicon carbide semiconductor device 100 according to the embodiment is described. FIG. 2 to FIG. 9 are cross-sectional views illustrating the method for manufacturing the silicon carbide semiconductor device according to the embodiment.

Figure 2:
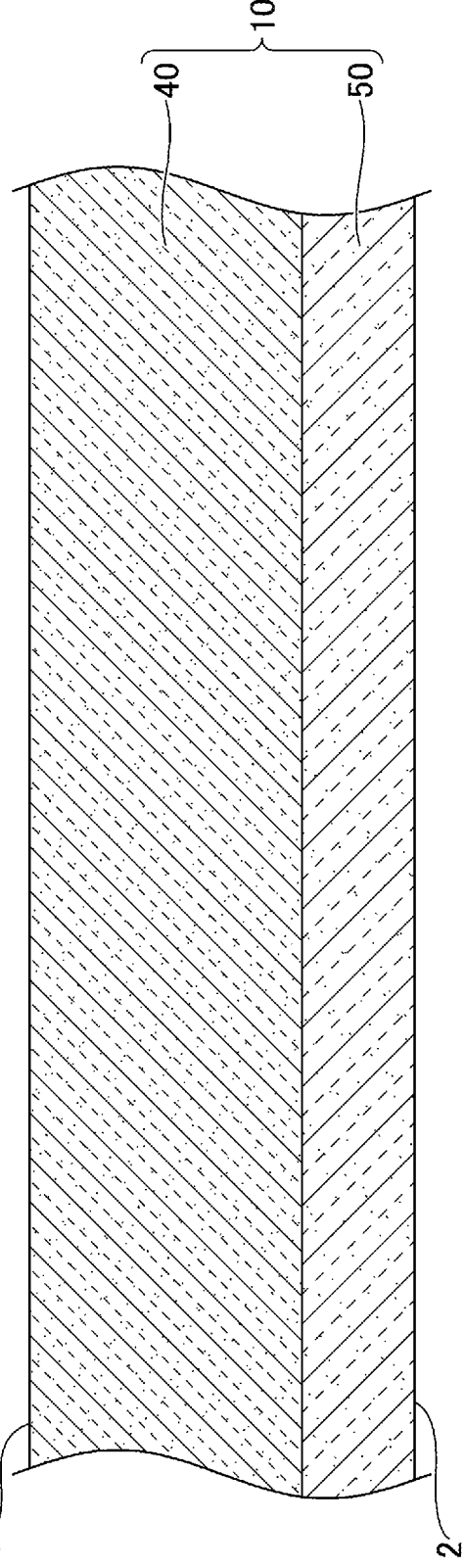
FIG. 2 is a cross-sectional view (part 1) illustrating a method for manufacturing the silicon carbide semiconductor device according to the embodiment.

First, as illustrated in FIG. 2, the silicon carbide single-crystal substrate 50 is prepared. Next, the silicon carbide epitaxial layer 40 is formed on the silicon carbide single-crystal substrate 50. For example, the silicon carbide single-crystal substrate 50 contains an n-type impurity such as nitrogen, and thus has an n-type. For example, the silicon carbide epitaxial layer 40 doped with an n-type impurity such as nitrogen is formed by epitaxial growth. The silicon carbide substrate 10 having the first main surface 1 and the second main surface 2 is obtained in this manner.

Figure 3:
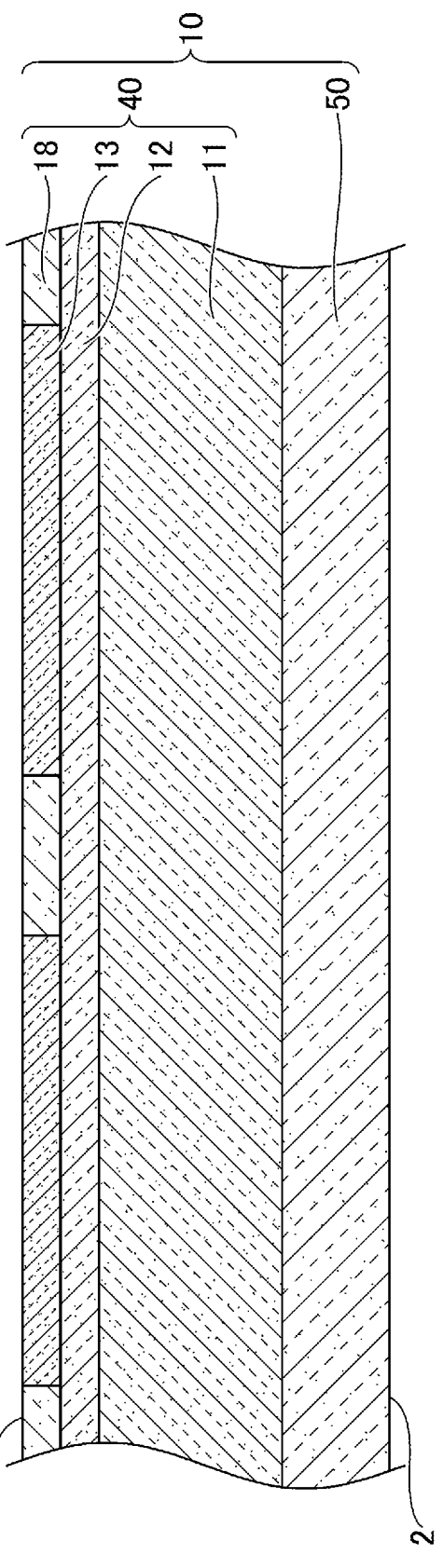
FIG. 3 is a cross-sectional view (part 2) illustrating the method for manufacturing the silicon carbide semiconductor device according to the embodiment.

Next, ion implanting into the silicon carbide epitaxial layer 40 is performed, as illustrated in FIG. 3. For example, the body region 12, the source region 13, and the contact region 18 are formed by the ion implantation. The remaining portion of the silicon carbide epitaxial layer 40 functions as the drift region 11. In the ion implantation for forming either the body region 12 or the contact region 18, a p-type impurity, such as aluminum (Al) is ion implanted. In the ion implantation for forming the source region 13, an n-type impurity such as phosphorus is ion implanted, for example.

Figure 4:
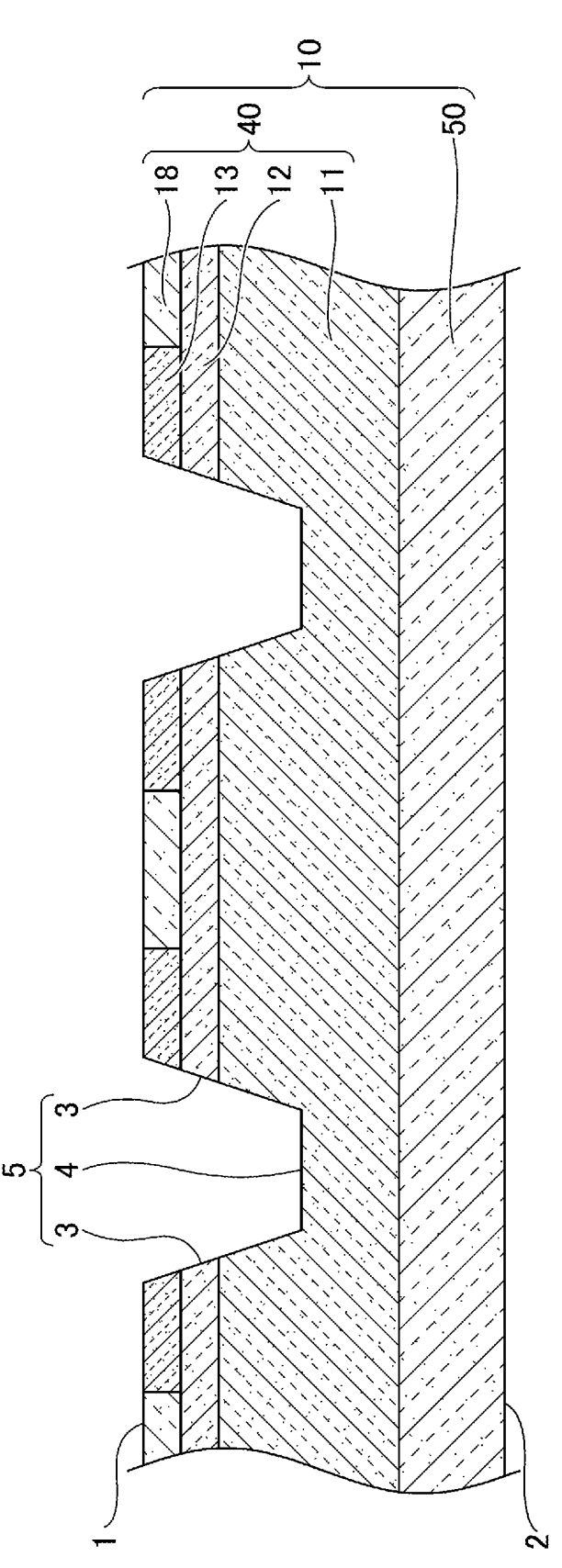
FIG. 4 is a cross-sectional view (part 3) illustrating the method for manufacturing the silicon carbide semiconductor device according to the embodiment.

Next, as illustrated in FIG. 4, multiple gate trenches 5 are formed in the source region 13, the body region 12, and the drift region 11. The gate trench 5 can be formed as follows.

First, a mask (not illustrated) having an opening on the region where the gate trench 5 is to be formed is formed. Next, using the mask, a portion of the source region 13, a portion of the body region 12, and a portion of the drift region 11 are removed by etching. The etching is, for example, reactive ion etching (RIE). By etching, in a region where the gate trench 5 is to be formed, a recess having a side portion substantially perpendicular to the first main surface 1 and a bottom portion provided continuously with the side portion and substantially parallel to the first main surface 1 is formed.

Next, thermal etching is performed in the recess. The thermal etching can be performed, for example, by performing heating in an atmosphere containing a reactive gas having at least one or more kinds of halogen atoms in a state where the mask layer is formed on the first main surface 1. The at least one or more kinds of halogen atom includes at least either a chlorine (Cl) atom or a fluorine (F) atom. The atmosphere includes, for example, chloride ($Cl_2$), boron trichloride ($BCl_3$), sulfur hexafluoride ($SF_6$), or tetrafluoromethane ($CF_4$). For example, a mixture gas of chlorine gas and oxygen ($O_2$) gas is used as a reactive gas, and thermal etching is performed at a heat treatment temperature of, for example, 800° C. or greater and 900° C. or less. Here, the reactive gas may include a carrier gas in addition to the chlorine gas and the oxygen gas described above. As the carrier gas, for example, nitrogen ($N_2$) gas, argon (Ar) gas, helium (He) gas, or the like can be used.

The gate trench 5 is formed on the first main surface 1 by the etching. The gate trench 5 has the bottom surface 4 formed by the drift region 11 and has side surfaces 3 that pass through the source region 13 and the body region 12 and that are continuous with the bottom surface 4. After the thermal etching, the mask is removed from the first main surface 1.

Figure 5:
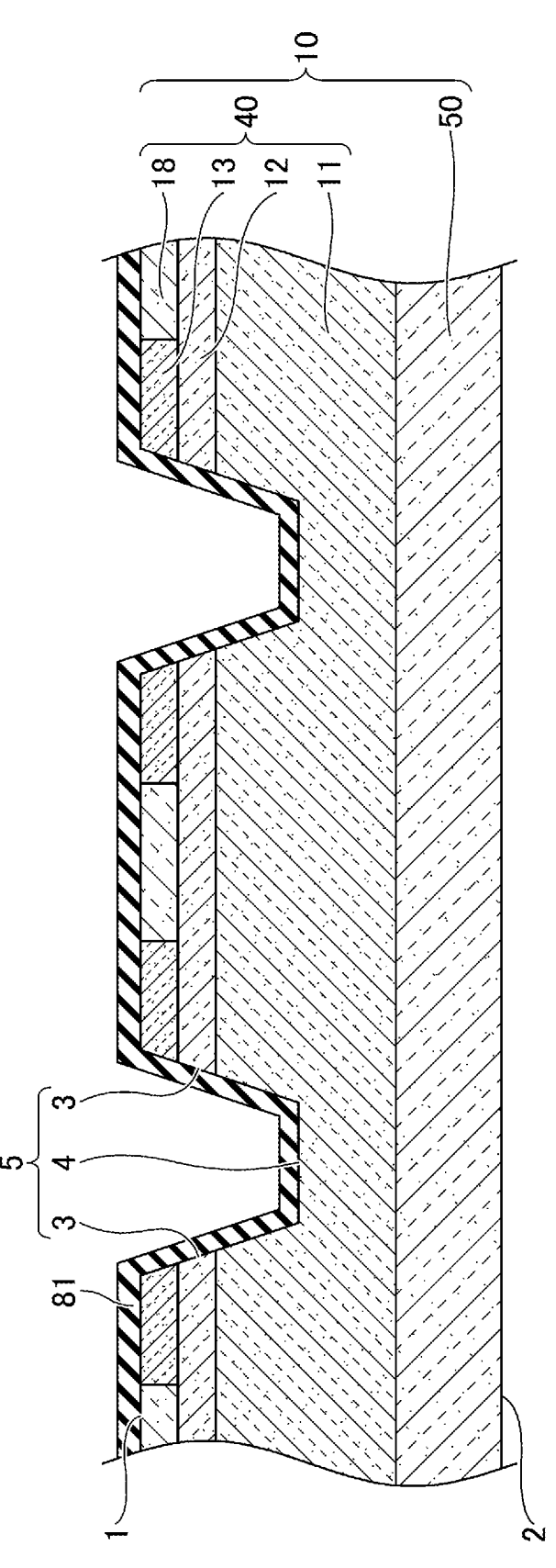
FIG. 5 is a cross-sectional view (part 4) illustrating the method for manufacturing the silicon carbide semiconductor device according to the embodiment.

Next, as illustrated in FIG. 5, the gate insulating film 81 is formed. For example, the silicon carbide substrate 10 is thermally oxidized to form the gate insulating film 81 that is in contact with the source region 13, the body region 12, the drift region 11, and the contact region 18. Specifically, the silicon carbide substrate 10 is heated in an atmosphere containing oxygen, for example, at a temperature of 1,300° C. or greater and 1,400° C. or less. This forms the gate insulating film 81 that is in contact with the first main surface 1, the side surfaces 3, and the bottom surface 4. Here, in the case where the gate insulating film 81 is formed by thermal oxidation, strictly speaking, a portion of the silicon carbide substrate 10 is taken into the gate insulating film 81. Therefore, in the subsequent processing, it is assumed that the first main surface 1, the side surfaces 3, and the bottom surface 4 have slightly moved to the interface between the gate insulating film 81 and the silicon carbide substrate 10 after thermal oxidation.

Next, heat treatment (NO annealing) may be performed on the silicon carbide substrate 10 in a nitric oxide (NO) gas atmosphere. In the NO annealing, the silicon carbide substrate 10 is kept, under a condition of 1,100° C. or greater and 1,400° C. or less for approximately one hour, for example. By doing so, nitrogen atoms get introduced into an interface region between the gate insulating film 81 and the body region 12. As a result, formation of an interface state at the interface region is suppressed, and thus channel mobility can be improved.

Figure 6:
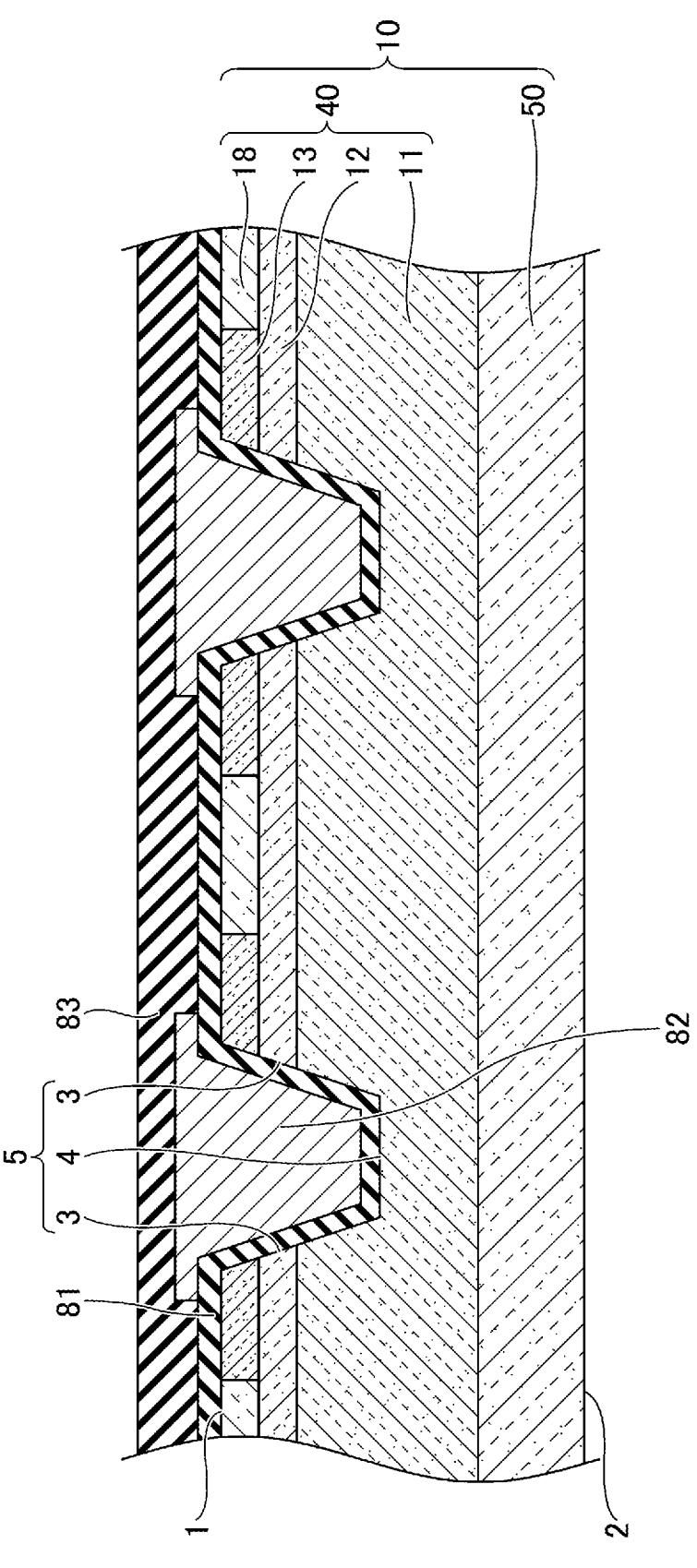
FIG. 6 is a cross-sectional view (part 5) illustrating the method for manufacturing the silicon carbide semiconductor device according to the embodiment.

Next, the gate electrode 82 is formed, as illustrated in FIG. 6. The gate electrode 82 is formed on the gate insulating film 81. The gate electrode 82 is formed by, for example, a low pressure-chemical vapor deposition (LP- CVD) method. The gate electrode 82 is formed such that the gate electrode 82 faces each of the source region 13, the body region 12, and the drift region 11.

Next, the interlayer insulating film 83 is formed. Specifically, the interlayer insulating film 83 is formed to cover the gate electrode 82 and to be in contact with the gate insulating film 81. The interlayer insulating film 83 is formed by, for example, a CVD method. The interlayer insulating film 83 is made of, for example, a material containing silicon dioxide. A portion of the interlayer insulating film 83 may be formed inside the gate trench 5.

Figure 7:
FIG. 7 is a cross-sectional view (part 6) illustrating the method for manufacturing the silicon carbide semiconductor device according to the embodiment.

Next, as illustrated in FIG. 7, the interlayer insulating film 83 and the gate insulating film 81 are etched to form the contact hole 90 in the interlayer insulating film 83 and the gate insulating film 81. As a result, the source region 13 and the contact region 18 are exposed from the interlayer insulating film 83 and the gate insulating film 81. Next, a metal film (not illustrated) for the contact electrode 61 that is in contact with the source region 13 and the contact region 18 in the first main surface 1 is formed. The metal film for the contact electrode 61 is formed by, for example, sputtering. The metal film for the contact electrode 61 is made of, for example, a material containing nickel. Next, alloying annealing is performed. The metal film for the contact electrode 61 is kept, for example, at a temperature of 900° C. or greater and 1,100° C. or less for approximately 5 minutes. By doing so, at least a portion of the metal film for the contact electrode 61 reacts with silicon contained in the silicon carbide substrate 10 to silicide. The contact electrode 61 is in ohmic contact with the source region 13 and the contact region 18. The contact electrode 61 may be made of a material containing titanium, aluminum, and silicon.

Figure 8:
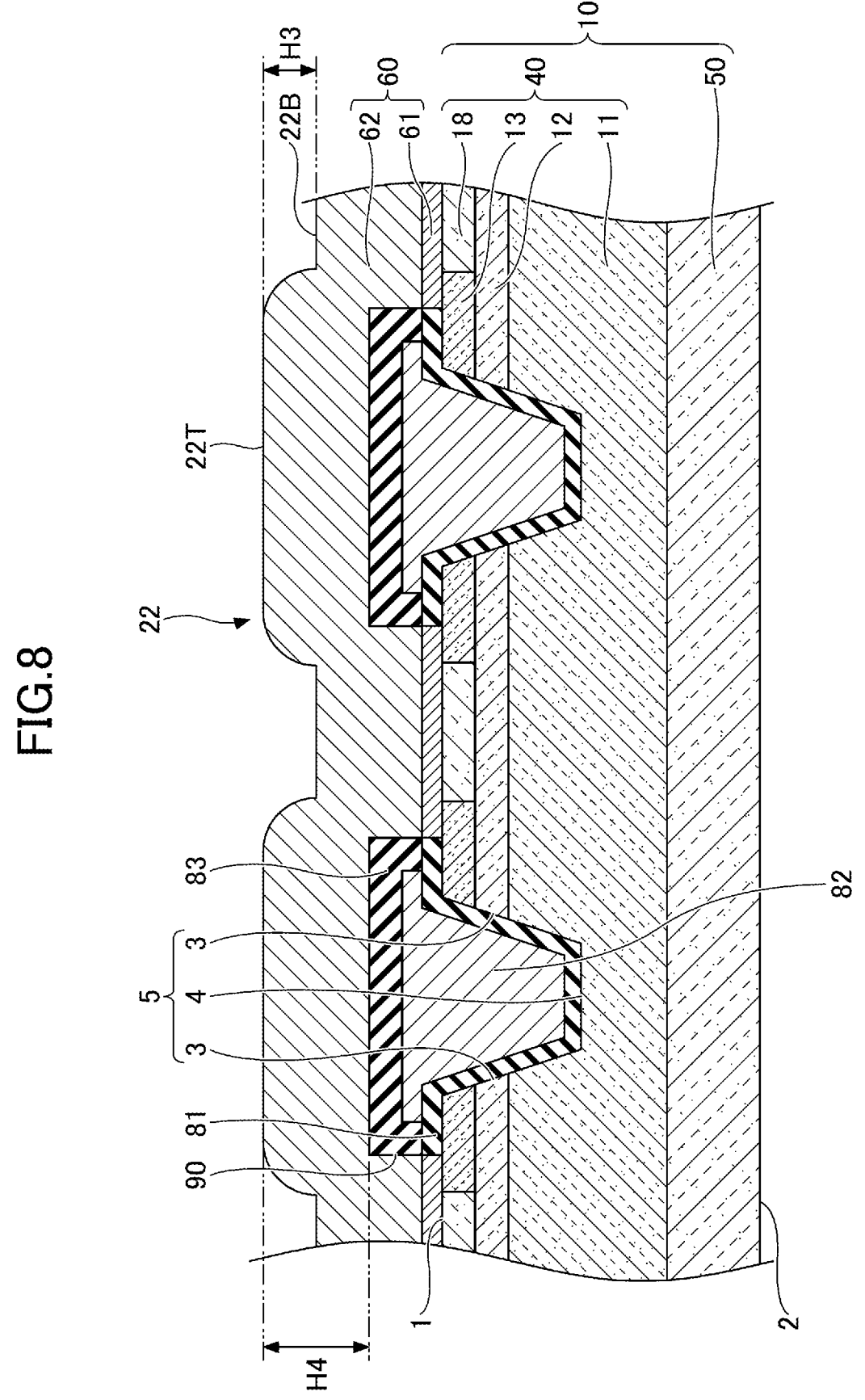
FIG. 8 is a cross-sectional view (part 7) illustrating the method for manufacturing the silicon carbide semiconductor device according to the embodiment.

Next, the source wiring 62 is formed, as illustrated in FIG. 8. Specifically, the source wiring 62 covering both the contact electrode 61 and the interlayer insulating film 83 is formed. The second irregularity 22 reflecting the contact hole 90 is formed on the surface of the source wiring 62. The source wiring 62 is formed by, for example, sputtering. The source wiring 62 is made of, for example, a material containing aluminum or copper. The source wiring 62 may be made of a material containing aluminum and copper. As described, the source electrode 60 including the contact electrode 61 and the source wiring 62 is formed. For example a relationship of $0.30 \leq H3/H4 \leq 0.80$ (i.e., H3/H4 is 0.30 or greater and 0.80 or less) is established, where H3 is the difference between a maximum value of the distance to a top 22T of the second irregularity 22 from the first main surface 1 and a minimum value of a distance to a bottom 22B of the second irregularity 22 from the first main surface 1, and H4 is a minimum value of the thickness of the source electrode 60.

Figure 9:
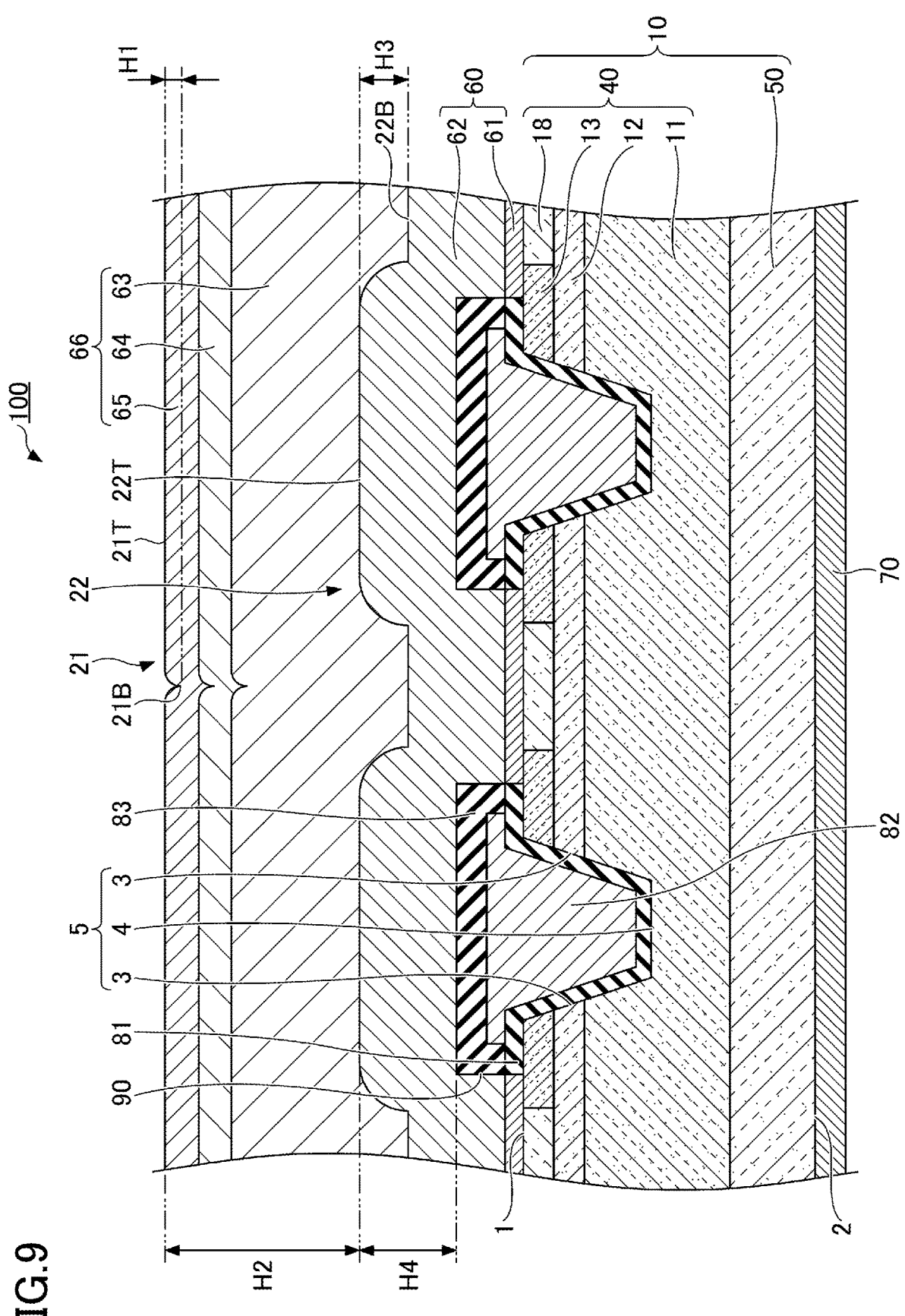
FIG. 9 is a cross-sectional view (part 8) illustrating the method for manufacturing the silicon carbide semiconductor device according to the embodiment.

Next, the plating film 66 is formed on the source electrode 60, as illustrated in FIG. 9. In the forming of the plating film 66, the Ni plating film 63 is formed on the source electrode 60, the Pd plating film 64 is formed on the Ni plating film 63, and the Au plating film 65 is formed on the Pd plating film 64. The Ni plating film 63, the Pd plating film 64, and the Au plating film 65 can be formed by, for example, electroless plating. Further, the drain electrode 70 that is in contact with the silicon carbide single-crystal substrate 50 at the second main surface 2. The first irregularity 21 reflecting the second irregularity 22 of the source electrode 60 is formed on the surface of the plating film 66. For example a relationship of $H1/H \leq 0.10$ (i.e., H1/H2 is 0.10 or less) is established, where H1 is the difference between a maximum value of the distance to the top 21T of the first irregularity 21 from the first main surface 1 and a minimum value of a distance to a bottom 21B of the first irregularity 21 from the first main surface 1, and H2 is a minimum value of the thickness of the plating film 66.

As described, the silicon carbide semiconductor device 100 including a field effect transistor can be manufactured.

With the silicon carbide semiconductor device 100 according to the embodiment, a relationship of H1/H2≤0.10 (i.e., H1/H2 is 0.10 or less) is established, where H1 is the difference between a maximum value of the distance to the top 21T of the first irregularity 21 from the first main surface 1 and a minimum value of a distance to a bottom 21B of the first irregularity 21 from the first main surface 1, and H2 is a minimum value of the thickness of the plating film 66. Therefore, the stress concentration on the plating film 66 due to wiring bonding to the plating film 66 is mitigated, and thus, cracking in the plating film 66 caused by wire bonding can be suppressed. It is to be noted that the value of H1/H2 is preferably, 0.09 or less, more preferably 0.08 or less, and even more preferably 0.07 or less. Alternatively, the value of H1/H2 may be 0.10 or greater. Reason being, in order to bring the value of H1/H2 to less than 0.10, processing such as polishing or the like is necessary, and thus manufacturing productivity might drop.

In the present embodiment, the gate electrode 82 is formed on the first main surface 1, the interlayer insulating film 83 covers the gate electrode 82, and the source electrode 60 covers the interlayer insulating film 83. Therefore, the gate electrode 82 and the source electrode 60 are isolated from each other. The existence of the second irregularity 22 reflecting the shape of the interlayer insulating film 83 on the surface of the source electrode 60 can suppress crack occurrence of the plating film 66.

Also, the value of H3/H4 is preferably 0.80 or less. Reason being, when the value of H3/H4 exceeds 0.80, the second irregularity 22 of the source electrode 60 is large, and consequently the first irregularity 21 in the surface of the plating film 66 is less likely to be suppressed. The value of H3/H4 is more preferably 0.75 or less, and even more preferably 0.70 or less. Further, the value of H3/H4 is preferably 0.30 or greater. Reason being, when the value of H3/H4 is less than 0.30, the source electrode 60 is thick, and consequently this might lead to a drop in manufacturing productivity. The value of H3/H4 is more preferably 0.35 or greater, and even more preferably 0.40 or greater.

Since the source electrode 60 contains Al or an Al alloy, it is easy to keep the electrical resistance of the source electrode 60 low.

Since the plating film 66 includes the Ni plating film 63, it is easy to keep the source electrode 60 protected. In addition, since the plating film 66 includes the Au plating film 65, it is easy to obtain excellent corrosion resistance in the plating film 66. Furthermore, since the plating film 66 includes the Pd plating film 64, it is easy to suppress denaturation of the Ni plating film 63 when the Au plating film 65 is formed. It is to be noted that the average crystal grain size at the surface of the Ni plating film 63 is preferably 1.0 μm or greater and 20.0 μm or less, more preferably 3.0 μm or greater and 17.5 μm or less, and even more preferably 5.0 μm or greater and 15.0 μm or less. The larger the average crystal grain size is at the surface of the 63 Ni plating film, the less likely it is to crack. However, in order to make the average crystal grain size at the surface of the Ni plating film 63 larger, it may be necessary to perform processing that could cause a drop in manufacturing productivity. Examples of such processing include forming the Ni plating film 63 more thickly. A silver (Ag) plating film may be used instead of the Au plating film 65.

The plating film 66 may include a copper (Cu) plating film instead of the laminate of the Ni plating film 63, the Pd plating film 64, and the Au plating film 65. In such a case, it is easy to keep the source electrode 60 protected. The average crystal grain size at the surface of the Cu plating film is preferably 1.0 μm or greater and 20.0 μm or less, more preferably 3.0 μm or greater and 17.5 μm or less, and even more preferably 5.0 μm or greater and 15.0 μm or less. The larger the average crystal grain size is at the surface of the Cu plating film, the less likely it is to crack. However, in order to make the average crystal grain size at the surface of the Cu plating film larger, it may be necessary to perform processing that could cause a drop in manufacturing productivity. Examples of such processing include forming the Cu plating film more thickly. Also, the plating film 66 may include a TaN film or a TiN film formed between the source electrode 60 and the Cu plating film. In such a case, the TaN film or the TiN film can function as a barrier metal.

The semiconductor elements included in the semiconductor device according to the present disclosure are not limited to a MOS transistor. For example, the semiconductor device may include an insulated gate bipolar transistor (IGBT), a Schottky barrier diode (SBD), or the like.

Although the embodiments have been described in detail above, the embodiments are not limited to a specific embodiment, and various modifications and changes can be made within the scope described in the claims.

DESCRIPTION OF THE REFERENCE NUMERALS

1 First main surface
2 Second main surface
3 Side surface
4 Bottom surface
5 Gate trench
10 Silicon carbide substrate
11 Drift region
12 Body region
13 Source region
18 Contact region
21 First irregularity
21B Bottom
21T Top
22 Second irregularity
22B Bottom
22T Top
40 Silicon carbide epitaxial layer
50 Silicon carbide single-crystal substrate
60 Source electrode (First electrode)
61 Contact electrode
62 Source wiring
63 Ni plating film
64 Pd plating film
65 Au plating film
66 Plating film
70 Drain electrode
81 Gate insulating film
82 Gate electrode (Second electrode)
83 Interlayer insulating film (Insulating film)
90 Contact hole
100 Silicon carbide semiconductor device

The invention claimed is:

1. A silicon carbide semiconductor device comprising:
a silicon carbide substrate having a first main surface;
a first electrode formed on the first main surface; and
a plating film formed on the first electrode, wherein a first irregularity is formed on a surface of the plating film, and H1/H2 is 0.10 or less, where H1 is a difference between a maximum value of a distance to a top of the first irregularity from the first main surface and a minimum value of a distance to a bottom of the first irregularity from the first main surface, and H2 is a minimum value of a thickness of the plating film.

2. The silicon carbide semiconductor device as claimed in claim 1, wherein a second irregularity is formed on a surface of the first electrode, and H3/H4 is 0.30 or greater and 0.80 or less, where H3 is a difference between a maximum value of a distance to a top of the second irregularity from the first main surface and a minimum value of a distance to a bottom of the second irregularity from the first main surface, and H4 is a minimum value of a thickness of the first electrode.

3. The silicon carbide semiconductor device as claimed in claim 1, wherein H1/H2 is 0.01 or greater and 0.10 or less.

4. The silicon carbide semiconductor device as claimed in claim 1, wherein the first electrode contains aluminum or an aluminum alloy.

5. The silicon carbide semiconductor device as claimed in claim 1, wherein the plating film includes a nickel plating film.

6. The silicon carbide semiconductor device as claimed in claim 5, wherein an average crystal grain size at a surface of the nickel plating film is 1.0 μm or greater and 20.0 μm or less.

7. The silicon carbide semiconductor device as claimed in claim 5, wherein the plating film further includes either a gold plating film or a silver plating film formed on or above the nickel plating film.

8. The silicon carbide semiconductor device as claimed in claim 7, wherein the plating film further includes a palladium plating film that is formed between the nickel plating film and either the gold plating film or the silver plating film.

9. The silicon carbide semiconductor device as claimed in claim 1, wherein the plating film includes a copper plating film.

10. The silicon carbide semiconductor device as claimed in claim 9, wherein an average crystal grain size at a surface of the copper plating film is 1.0 μm or greater and 20.0 μm or less.

11. The silicon carbide semiconductor device as claimed in claim 9, wherein the plating film further includes a tantalum nitride film or a titanium nitride film formed between the first electrode and the copper plating film.

12. The silicon carbide semiconductor device as claimed in claim 1, further comprising a second electrode formed on the first main surface; and an insulating film that covers the second electrode, wherein the first electrode covers the insulating film.

\* \* \* \* \*